United States Patent
Oh et al.

(10) Patent No.: US 7,394,285 B2
(45) Date of Patent: Jul. 1, 2008

(54) CIRCUIT FOR DRIVING BUS

(75) Inventors: Ic-Su Oh, Kyoungki-do (KR); Yong-Ju Kim, Kyoungki-do (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 67 days.

(21) Appl. No.: 11/480,599

(22) Filed: Jun. 30, 2006

(65) Prior Publication Data

US 2007/0069589 A1    Mar. 29, 2007

(30) Foreign Application Priority Data

Sep. 29, 2005    (KR)    ............. 10-2005-0091684
Dec. 2, 2005    (KR)    ............. 10-2005-0117123

(51) Int. Cl.
*H03K 19/003*    (2006.01)

(52) U.S. Cl. .............................. 326/38; 326/11

(58) Field of Classification Search ............ 326/11, 326/35, 37–41, 47, 101, 86–87, 82–83, 112; 341/50–51, 55; 714/797, 760
See application file for complete search history.

(56) References Cited

U.S. PATENT DOCUMENTS

| | | | |
|---|---|---|---|
| 5,381,416 A * | 1/1995 | Vartti et al. | 714/700 |
| 5,533,032 A | 7/1996 | Johnson | |
| 5,818,884 A | 10/1998 | Reymond | |
| 6,396,301 B1 * | 5/2002 | Wallace et al. | 326/31 |
| 6,480,019 B2 * | 11/2002 | Waldie et al. | 326/16 |
| 6,937,527 B1 | 8/2005 | Lotz et al. | |
| 7,081,842 B2 * | 7/2006 | Cranford et al. | 341/121 |
| 7,250,786 B1 * | 7/2007 | Trimberger | 326/11 |
| 2005/0168257 A1 * | 8/2005 | Cabanas-Holmen et al. | 327/199 |
| 2005/0242828 A1 * | 11/2005 | Lotz et al. | 326/11 |
| 2005/0251729 A1 * | 11/2005 | Lotz et al. | 714/797 |

FOREIGN PATENT DOCUMENTS

| | | |
|---|---|---|
| JP | 05-028107 | 2/1993 |
| JP | 07-146733 | 6/1995 |
| JP | 10-093424 | 4/1998 |
| JP | 10-340212 | 12/1998 |
| JP | 2000-269423 | 9/2000 |
| JP | 2004-80553 | 3/2004 |
| JP | 2004-336123 | 11/2004 |
| KR | 2003-0038411 | 5/2003 |

OTHER PUBLICATIONS

Kazuyuki Nakamura et al., "A 50% Noise Reduction Interface Using Low-Weight Coding", 1996 Symposium on VLSI Circuits Digest of Technocal Papers, 1996 IEEE (pages 144-145).

* cited by examiner

*Primary Examiner*—Rexford Barnie
*Assistant Examiner*—Thienvu V Tran
(74) *Attorney, Agent, or Firm*—Blakely, Sokoloff, Taylor & Zafman LLP

(57) ABSTRACT

A bus driving circuit includes a majority voter unit for comparing the number of logic high level bits with the number of logic low level bits among a predetermined number of bits of data; a latch unit for latching a first output signal in response to the compared result; and a flip-flop unit for latching the predetermined number of bits of data in synchronization with the clock; and a selection unit for selecting one of the latched data of the flip-flop unit and an inverted output of the latched data of the flip-flop unit according to the first output signal.

23 Claims, 3 Drawing Sheets

(A) ENCODER  (B) DECODER

CIRCUIT FOR DRIVING BUS

FIELD OF THE INVENTION

The present invention relates to a bus driving circuit; and, more particularly, to a bus driving circuit for reducing simultaneous switching noise output (SSO) and power consumption by using a clocked voter circuit capable of high-speed data transfer.

DESCRIPTION OF RELATED ARTS

FIG. 1 is a block diagram showing a codec (encoder/decoder) circuit included in a conventional bus driving circuit disclosed in the reference "A 50% noise reduction interface using low-weight coding" (Nakamura, K.; Horowitz, M. A.; VLSI Circuits, 1996).

Referring to FIG. 1, an analog majority voter included in the codec circuit generates a sign signal SIGN if an 8-bit data is inputted to the analog majority voter. The codec circuit uses an exclusive OR gate in order to synchronize an output of the analog majority voter with a clock CLK.

FIG. 2 is a schematic circuit diagram showing the analog majority voter shown in FIG. 1.

As shown in FIG. 2, the analog majority voter receives a plurality of outputs X0 to X7 from an internal logic circuit to thereby determine which one of the two logic states, i.e., a logic high level and a logic low level, is more frequent than the other among the plurality of outputs. For instance, if the number of logic high levels is equal to or greater than 4 among 8-bit data received from the internal logic circuit, the sign signal SIGN is outputted as a logic high level. On the other hand, if the number of logic high levels is smaller than 4, the sign signal SIGN is outputted as a logic low level.

According to the sign signal SIGN, a selection circuit selects to thereby output an unimpaired data or an inverted data. However, since the conventional bus driving circuit uses the analog majority voter as a majority voter, the conventional bus driving circuit is disadvantageous for high-speed operation.

SUMMARY OF THE INVENTION

It is, therefore, an object of the present invention to provide a bus driving circuit for reducing a simultaneous switching noise output (SSO) and power consumption by using a clocked voter circuit capable of high-speed data transfer in a dynamic random access ram (DRAM) or a graphic DRAM which requires a high-speed data rate.

In accordance with an aspect of the present invention, there is provided a bus driving circuit, including: a majority voter unit for comparing the number of logic high level bits with the number of logic low level bits among predetermined number of bits of data; a latch unit for latching a first output signal in response to the compared result; and a flip-flop unit for latching the predetermined number of bits of data in synchronization with the clock; and a selection unit for selecting one of the latched data of the flip-flop unit and an inverted output of the latched data of the flip-flop unit according to the first output signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a bus driving circuit in accordance with the present invention will be described in detail referring to the accompanying drawings.

Figure 1:
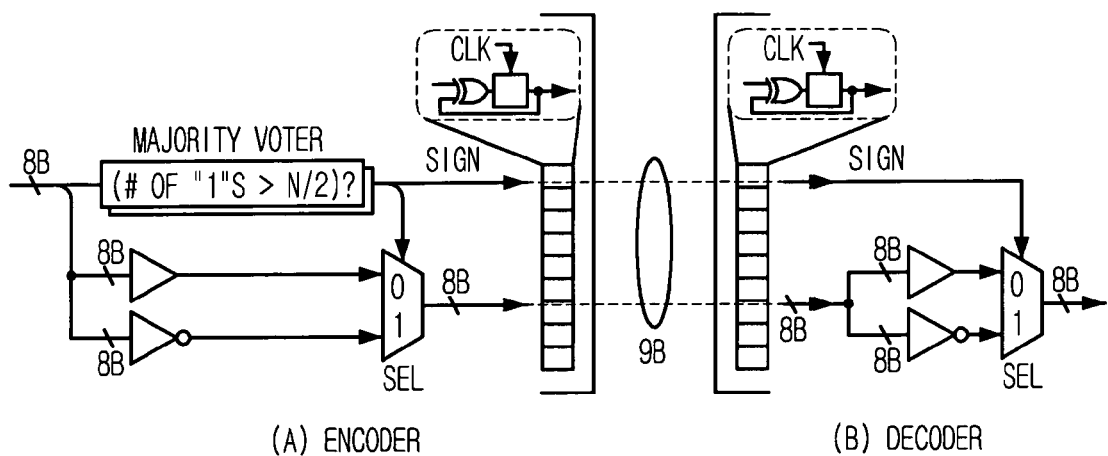
FIG. 1 is a block diagram showing a codec (encoder/decoder) circuit included in a conventional bus driving circuit.
Figure 2:
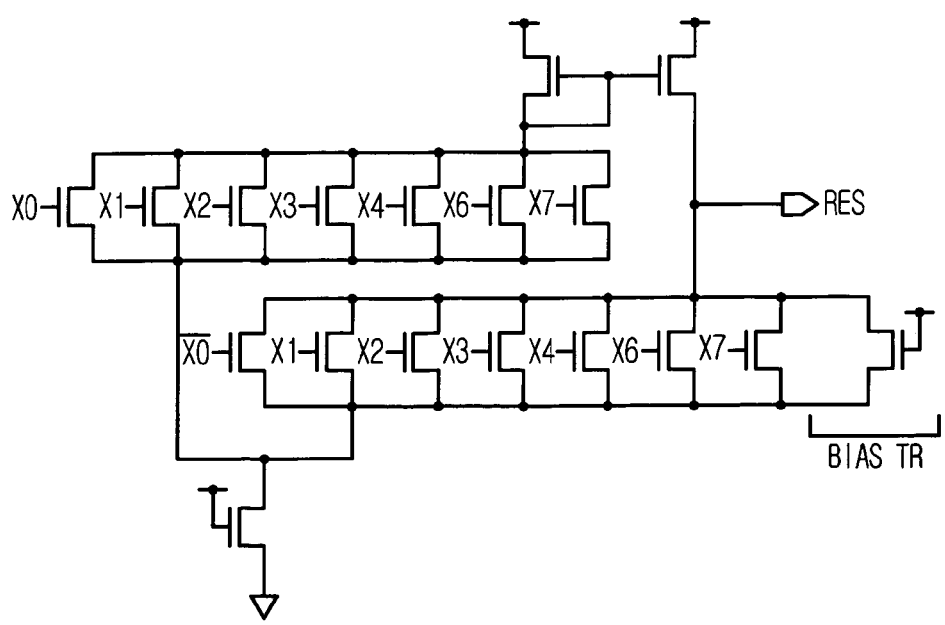
FIG. 2 is a schematic circuit diagram showing an analog majority voter shown in FIG. 1.
Figure 3:
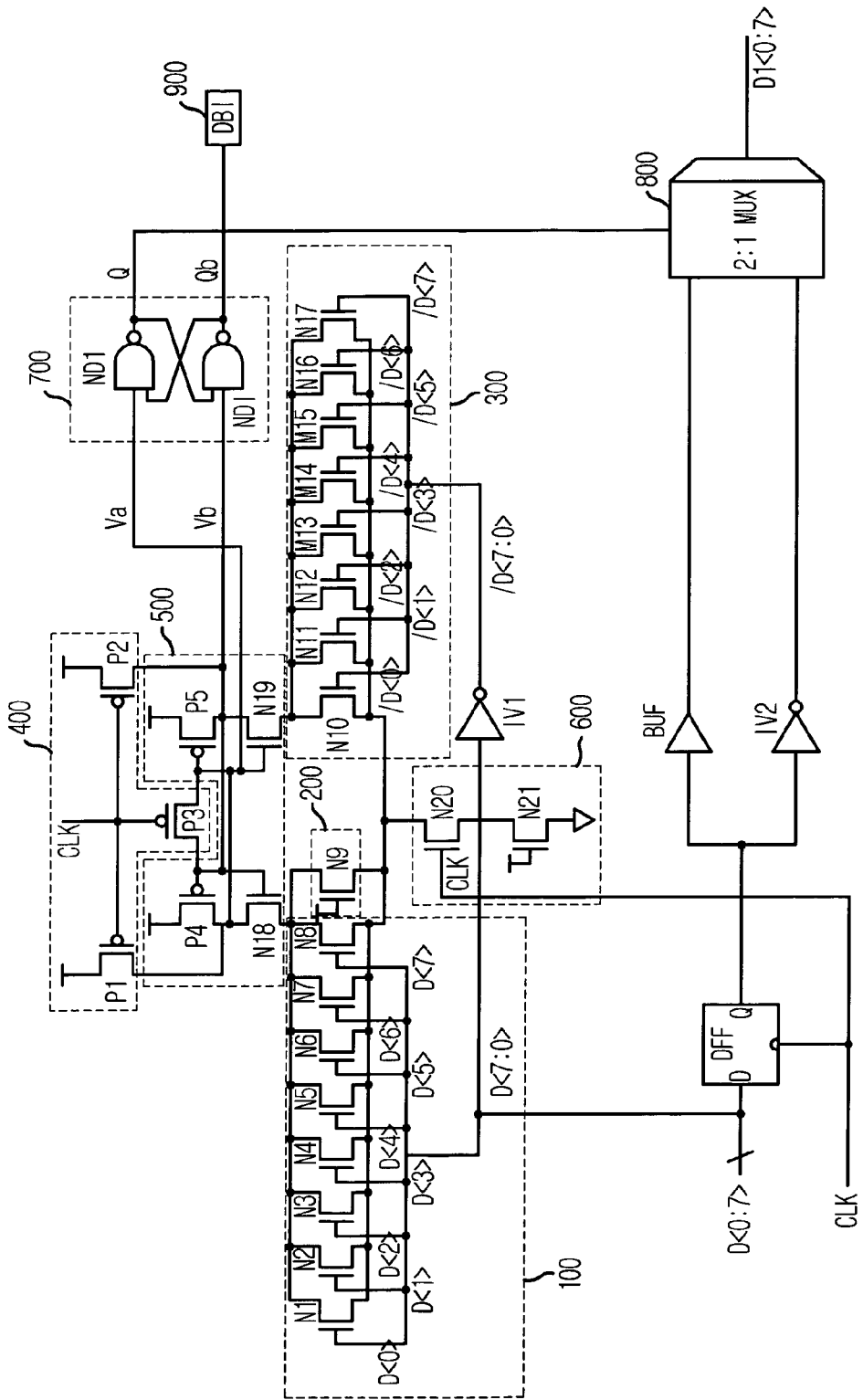
FIG. 3 is a schematic circuit diagram depicting a bus driving circuit in accordance with a preferred embodiment of the present invention.

FIG. 3 is a schematic circuit diagram depicting a bus driving circuit in accordance with a preferred embodiment of the present invention.

As shown, the bus driving circuit includes majority voters 100 and 300, an input terminal control unit 200, a precharge unit 400, a latch unit 500, an enable unit 600, an RS latch unit 700, a D-flip flop DFF, a multiplexer 800 and a data bus inversion (DBI) flag pin 900.

Herein, the majority voter 100 includes a plurality of n-type metal oxide semiconductor (NMOS) transistors N1 to N8. The plurality of NMOS transistors N1 to N8 are connected between the latch unit 500 and the enable unit 600 in order to receive an 8-bit data D<7:0> through each gate terminal. The input terminal control unit 200 includes an NMOS transistor N9 connected between the latch unit 500 and the enable unit 600. The NMOS transistor N9 receives a power supply voltage through a gate of the NMOS transistor N9 so that the NMOS transistor N9 is constantly turned on.

The majority voter 300 includes a plurality of NMOS transistors N10 to N17. The plurality of NMOS transistors N10 to N17 are connected between the latch unit 500 and the enable unit 600 in order to receive an inverted 8-bit data /D<7:0> through each gate terminal. The precharge unit 400 includes a plurality of p-type metal oxide semiconductor (PMOS) transistors P1 to P3 in order to receive a clock CLK through a commonly coupled gate terminal.

Herein, the PMOS transistor P1 is connected between the power supply voltage and a voltage Va. Similarly, the PMOS transistor P2 is connected between the power supply voltage and a voltage Vb. The PMOS transistor P3 is connected between gates of PMOS transistors P4 and P5.

The latch unit 500 includes the PMOS transistors P4 and P5 and NMOS transistors N18 and N19. Herein, the PMOS transistor P4 and the NMOS transistor N18 are connected in series between the power supply voltage and the majority voter 100 in order to receive the voltage Vb through a commonly coupled gate terminal. The PMOS transistor P5 and the NMOS transistor N19 are connected in series between the power supply voltage and the majority voter 300 in order to receive the voltage Va through a commonly coupled gate terminal.

The enable unit 600 includes NMOS transistors N20 and N21 connected in series among the majority voters 100 and 300 and a ground voltage. Herein, the NMOS transistor N20 receives the clock CLK through a gate of the NMOS transistor N20. A gate of the NMOS transistor N21 receives the power supply voltage so that the NMOS transistor N21 is constantly turned on.

The RS latch unit 700 includes RS latch-type NAND gates ND1 and ND2 in order to generate output signals Q and Qb having an opposite phase after latching the voltage Va and Vb.

The D-flip flop DFF flip flops the 8-bit data D<0:7> in synchronization with the clock CLK in order to output the flip flopped signal to a buffer BUF and an inverter IV2.

The multiplexer 800 selects one of an output of the buffer BUF and an output of the inverter IV2 according to the output signal Q in order to generate an output data D1<0:7>.

The DBI 900 receives the output signal Qb through a flag pin to output an inverted signal to a data bus of an external chip set.

Figure 4:
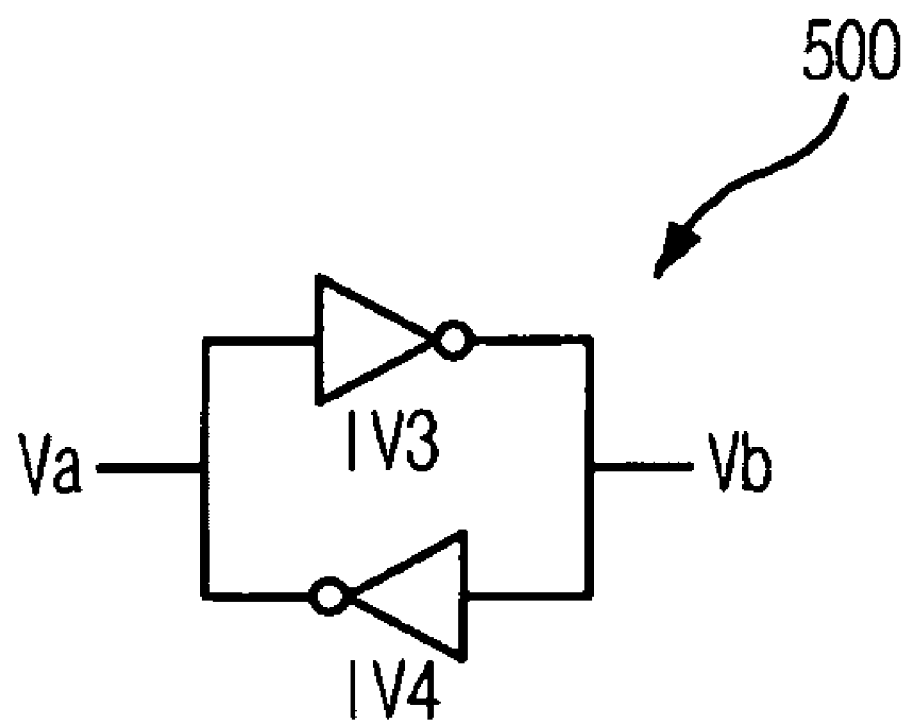
FIG. 4 is a symbol diagram showing a latch unit shown in FIG. 3.

FIG. 4 is a symbol diagram showing the latch unit 500 shown in FIG. 3.

As shown, the latch unit 500 can be symbolized by a cascoded circuit structured by inverters IV3 and IV4. The inverters IV3 and IV4 respectively invert the voltages Va and Vb.

An operation of the bus driving circuit is described below in detail referring to FIGS. 3 and 4.

The enable unit 600 enables the majority voters 100 and 300 and the input terminal control unit 200 when the NMOS transistor N20 is turned on in response to an activation of the clock CLK. Herein, the NMOS transistor N21 is constantly in the turned on state because the gate of the NMOS transistor N21 receives the power supply voltage.

The input terminal control unit 200 is constantly turned on since the power supply voltage is supplied to the gate of the NMOS transistor N9. The input terminal control unit 200 is provided to an input terminal of the majority voter 100 to thereby prevent a meta stable state. Herein, at the meta stable state, the number of '0's is equal to the number of '1's among the 8-bit data D<7:0>.

Thereafter, the 8-bit data D<7:0> including '0' or '1' is inputted to the majority voter 100 through the NMOS transistors N1 to N8. The inverted 8-bit data /D<7:0> including '0' or '1' inverted by the inverter IV1 is inputted to the majority voter 300 through the NMOS transistors N10 to N17.

The D-flip flop DFF flip flops the 8-bit data D<7:0> and outputs the flip flopped data in synchronization with the clock CLK. The buffer BUF buffers the output of the D-flip flop DFF so that the buffered signal is inputted to the multiplexer 800. The inverter IV2 inverts the output of the D-flip flop DFF so that the inverted signal is inputted to the multiplexer 800. Herein, a delay time generated while a signal is passed through the D-flip flop DFF and the inverter IV2 is the same as a delay time generated while a signal is passed through the majority voters 100 and 300 and the RS latch unit 700.

While the conventional bus driving circuit uses an exclusive OR gate for a synchronization with the clock CLK, in accordance with the present invention, the latch unit 500 and the precharge unit 400 are provided to the majority voters 100 and 300 so that the majority voters 100 and 300 are directly synchronized with the clock CLK.

That is, the majority voters 100 and 300 operated by the clock CLK respectively receive the 8-bit data D<7:0> and the inverted 8-bit data /D<7:0> from an internal logic circuit in order to determine which one of the two logic states is more frequent than the other. For instance, if the number of logic low levels is equal to or greater than 4 among the received 8-bit data D<7:0> or the inverted 8-bit data /D<7:0>, a high level signal is outputted to the latch unit 500. On the other hand, if the number of logic high levels is smaller than 4, a high level signal is outputted to the latch unit 500.

Thereafter, the latch unit 500 rapidly changes levels of the voltages Va and Vb to a high level or a low level. Herein, since the latch unit 500 includes the cascoded inverters IV3 and IV4, the voltages Va and Vb can be changed rapidly. That is, when the voltage Va is a high level, the NMOS transistor N19 is turned on so that the voltage Vb becomes a low level according to the output of the majority voter 300. When the voltage Vb is at a high level, the voltage Va becomes a low level according to the output of the majority voter 100. Herein, when the clock CLK is inactivated as a low level, all the PMOS transistors P1 to P3 included in the precharge unit 400 are turned on so that the voltage Va and Vb are precharged to the power supply voltage level.

Thereafter, the output of the latch unit 500 is inputted to the RS latch unit 700. Then, the output signal Qb of the RS latch unit 700 is inputted to the DBI flag pin 900. The output signal Q is inputted to the multiplexer 800.

Therefore, the multiplexer 800 selects one of the output of the buffer BUF and the output of the inverter IV2 according to the output signal Q in order to output the selected signal as the output data D1<0:7>.

That is, when the voltage Va is a high level and the voltage Vb is a low level, the multiplexer 800 selects the output of the inverter IV2 according to the output signal Q in order to output the output data D1<0:7> as an inverted data. On the other hand, when the voltage Va is a low level and the voltage Vb is a high level, the multiplexer 800 selects the output of the buffer BUF according to the output signal Q in order to output the output data D1<0:7> as an non-inverted data.

For instance, when the 8-bit data D<0:7> is [01110011], the number of '1's is more frequent than that of '0's. Accordingly, the voltage Va is a low level and the voltage Vb is a high level. The output signal Q of the RS latch unit 700 is inputted to the multiplexer 800 and the output signal Qb is inputted to the DBI 900 and, thus, it is detected that the output data D1<0:7> outputted from the multiplexer 800 is an non-inverted data.

As above-mentioned, in accordance with the present invention, a simultaneous switching noise output (SSO) and a power consumption of a bus driving circuit can be reduced by using the clocked voter circuit capable of high-speed data transfer.

The present application contains subject matter related to Korean patent application No. 2005-91684 and 2005-117123 filed in the Korean Patent Office on Sep. 29, 2005 and Dec. 2, 2005, respectively, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A bus driving circuit, comprising:
   a majority voter unit for comparing a number of logic high level bits with a number of logic low level bits among a predetermined number of bits of data and outputting a compared result;
   a latch unit for latching a first output signal in response to the compared result; and
   a flip-flop unit for latching the predetermined number of bits of data in synchronization with a clock; and
   a selection unit for selecting one of the latched data of the flip-flop unit and an inverted output of the latched data of the flip-flop unit according to the first output signal,
   wherein the latch unit includes:
      a first latch unit for latching a first voltage and a second voltage changed respectively corresponding to the outputs of the majority voter unit to a logic high level or a logic low level; and a second latch unit for latching the first and the second voltages in order to generate the first output signal and a second output signal having an opposite phase of the first output signal.

2. The bus driving circuit as recited in claim 1, wherein the majority voter unit includes:
a first majority voter for detecting the number of logic high level bits and the number of logic low level bits among the predetermined number of bits of data and outputting a first detecting signal in response to the detected number of logic high level bits of the first majority voter; and
a second majority voter for detecting the number of logic high level bits and the number of logic low level bits among an inverted version of the predetermined number of bits of data and outputting a second detecting signal in response to the detected number of logic low level bits of the second majority voter.

3. The bus driving circuit as recited in claim 2, wherein the first majority voter includes a plurality of first NMOS transistors connected in parallel for receiving each bit of the predetermined number of bits of data through each gate terminal of the plurality of first NMOS transistors.

4. The bus driving circuit as recited in claim 2, wherein the second majority voter includes a plurality of second NMOS transistors connected in parallel for receiving each bit of the inverted version of the predetermined number of bits of data through each gate terminal of the plurality of second NMOS transistors.

5. The bus driving circuit as recited in claim 1, wherein the first latch unit includes a first inverter and a second inverter, wherein an input of the first inverter is coupled to an output of the second inverter and an output of the first inverter is coupled to an input of the second inverter.

6. The bus driving circuit as recited in claim 5, wherein the first latch unit includes:
a first PMOS transistor and a first NMOS transistor connected in series between a terminal of a power supply voltage and the majority voter unit wherein the first PMOS transistor and the first NMOS transistor have the first voltage supplied by a gate, respectively; and
a second PMOS transistor and a second NMOS transistor connected in series between a terminal of the power supply voltage and the majority voter unit wherein the second PMOS transistor and the second NMOS transistor have the first voltage supplied by a gate, respectively.

7. The bus driving circuit as recited in claim 1, wherein the first latch unit changes the first voltage into the logic low level when the number of the logic high level bits is more than the number of the logic low level bits among the predetermined number of bits of data and changes the second voltage into the logic high level when the number of logic low level bits is greater than the number of logic high level bits.

8. The bus driving circuit as recited in claim 1, wherein the second latch unit includes an RS-type latch.

9. The bus driving circuit as recited in claim 1, wherein the flip-flop unit includes a D-type flip-flop.

10. The bus driving circuit as recited in claim 1, further comprising a precharge unit for precharging a node to output the output voltage of the latch unit to a power supply voltage in response to a clock signal.

11. The bus driving circuit as recited in claim 10, wherein the precharge unit includes:
a third PMOS transistor connected between the terminal of the power supply voltage and a node for outputting the first voltage, having a gate terminal supplied the clock signal;

a fourth PMOS transistor connected between the terminal of the power supply voltage and a node for outputting the first voltage, having a gate terminal supply the clock signal; and
a fifth PMOS transistor connected between the first PMOS transistor and the second PMOS transistor, having a gate terminal supply the clock signal.

12. The bus driving circuit as recited in claim 1, further comprising an input terminal control unit for supplying a predetermined value into the latch unit when the number of the logic high level bits is equal to the number of the logic low level bits among the predetermined number of bits of data.

13. The bus driving circuit as recited in claim 12, wherein the input terminal control unit includes a fifth NMOS transistor coupled with the plurality of first NMOS transistors in parallel.

14. The bus driving circuit as recited in claim 1, wherein a delay time by the flip-flop unit and the selection unit is equal to a delay time occurring while a signal is passed through the majority voter unit and the latch unit into the selection unit.

15. The bus driving circuit as recited in claim 1, further comprising an enable unit for enabling the majority voter unit in response to transition timing of the clock.

16. The bus driving circuit as recited in claim 15, wherein the enable unit includes a sixth NMOS transistor and a seventh NMOS transistor connected in series between the majority voter unit and a terminal of a ground voltage, wherein the clock is inputted to a gate of the sixth NMOS transistor and the power supply voltage is inputted to a gate of the seventh NMOS transistor.

17. The bus driving circuit as recited in claim 1, further comprising a data bus inversion flag pin for outputting the second output signal into an external chip set.

18. A bus driving circuit, comprising:
a majority voter unit for comparing a number of logic high level bits with a number of logic low level bits among a predetermined number of bits of data and outputting a compared result;
a latch unit for latching a first output signal in response to the compared result; and
a flip-flop unit for latching the predetermined number of bits of data in synchronization with a clock; and
a selection unit for selecting one of the latched data of the flip-flop unit and an inverted output of the latched data of the flip-flop unit according to the first output signal,
wherein the selection unit includes:
a buffer for buffering the output of the flip-flop unit;
an inverter unit for inverting the output of the flip-flop unit; and
a multiplexer for selecting one of the output of the buffer and the output of the inverter unit based on the first output signal in order to output as an output data.

19. The bus driving circuit as recited in claim 18, wherein the majority voter unit includes:
a first majority voter for detecting the number of logic high level bits and the number of logic low level bits among the predetermined number of bits of data and outputting a first detecting signal in response to the detected number of logic high level bits of the first majority voter; and
a second majority voter for detecting the number of logic high level bits and the number of logic low level bits among an inverted version of the predetermined number of bits of data and outputting a second detecting signal in response to the detected number of logic low level bits of the second majority voter.

20. The bus driving circuit as recited in claim 18, further comprising a precharge unit for precharging a node to output the output voltage of the latch unit to a power supply voltage in response to a clock signal.

21. The bus driving circuit as recited in claim 18, further comprising an input terminal control unit for supplying a predetermined value into the latch unit when the number of the logic high level bits is equal to the number of the logic low level bits among the predetermined number of bits of data.

22. The bus driving circuit as recited in claim 18, further comprising an enable unit for enabling the majority voter unit in response to transition timing of the clock.

23. The bus driving circuit as recited in claim 18, further comprising a data bus inversion flag pin for outputting the second output signal into an external chip set.

* * * * *